United States Patent [19]

Roff

[11] Patent Number: 5,617,036

[45] Date of Patent: Apr. 1, 1997

[54] LASER/PIN ASSEMBLY WITH INTEGRATED BURN-IN ASSEMBLY

[75] Inventor: Robert W. Roff, Westfield, N.J.

[73] Assignee: The Whitaker Corporation, Wilmington, Del.

[21] Appl. No.: 674,305

[22] Filed: Jul. 1, 1996

Related U.S. Application Data

[63] Continuation of Ser. No. 393,961, Feb. 24, 1995, abandoned.

[51] Int. Cl.⁶ ............................ G01R 31/02; G01R 31/28
[52] U.S. Cl. ............................................ 324/760; 324/766
[58] Field of Search ........................... 324/73.1, 96, 659, 324/683, 686, 693, 702, 709, 719, 752, 760, 765, 766

[56] References Cited

U.S. PATENT DOCUMENTS

| | | | |
|---|---|---|---|
| 4,210,923 | 7/1980 | North et al. | 357/30 |
| 4,897,711 | 1/1990 | Blonder et al. | 357/74 |
| 4,961,053 | 10/1990 | Krug | 324/73.1 |
| 5,268,635 | 12/1993 | Bortolini et al. | 324/96 |
| 5,357,103 | 10/1994 | Sasaki | 250/227 |
| 5,371,352 | 12/1994 | Yoshida | 250/208.2 |
| 5,479,426 | 12/1995 | Nakanishi et al. | 372/43 |

OTHER PUBLICATIONS

*Electronic Letters* "Self–Aligned Flat–Pack Fibre–Photodiode Coupling"; Jul. 1988; vol. 24; No. 15.

*IEEE Transactions On Components, Hybrids And Manufacturing Technology*; "Gigabit Transmitter Array Modules on Silicon Waferboard"; Craig A. Armiento; vol. 15; No. 6; Dec. 1992.

"1995 Proceedings 45th Electronic Components & Technology Conference – May 21–May 24, 1995"; pp. 841–845.

*Primary Examiner*—Ernest F. Karlsen

[57] ABSTRACT

A burn-in assembly is disclosed having a substrate on which devices to be tested are die and wire bonded. Circuitry for effecting the burn-in testing is connected to the devices under test, and after testing is complete, the substrate is diced into individual optical submounts for packaging.

7 Claims, 10 Drawing Sheets

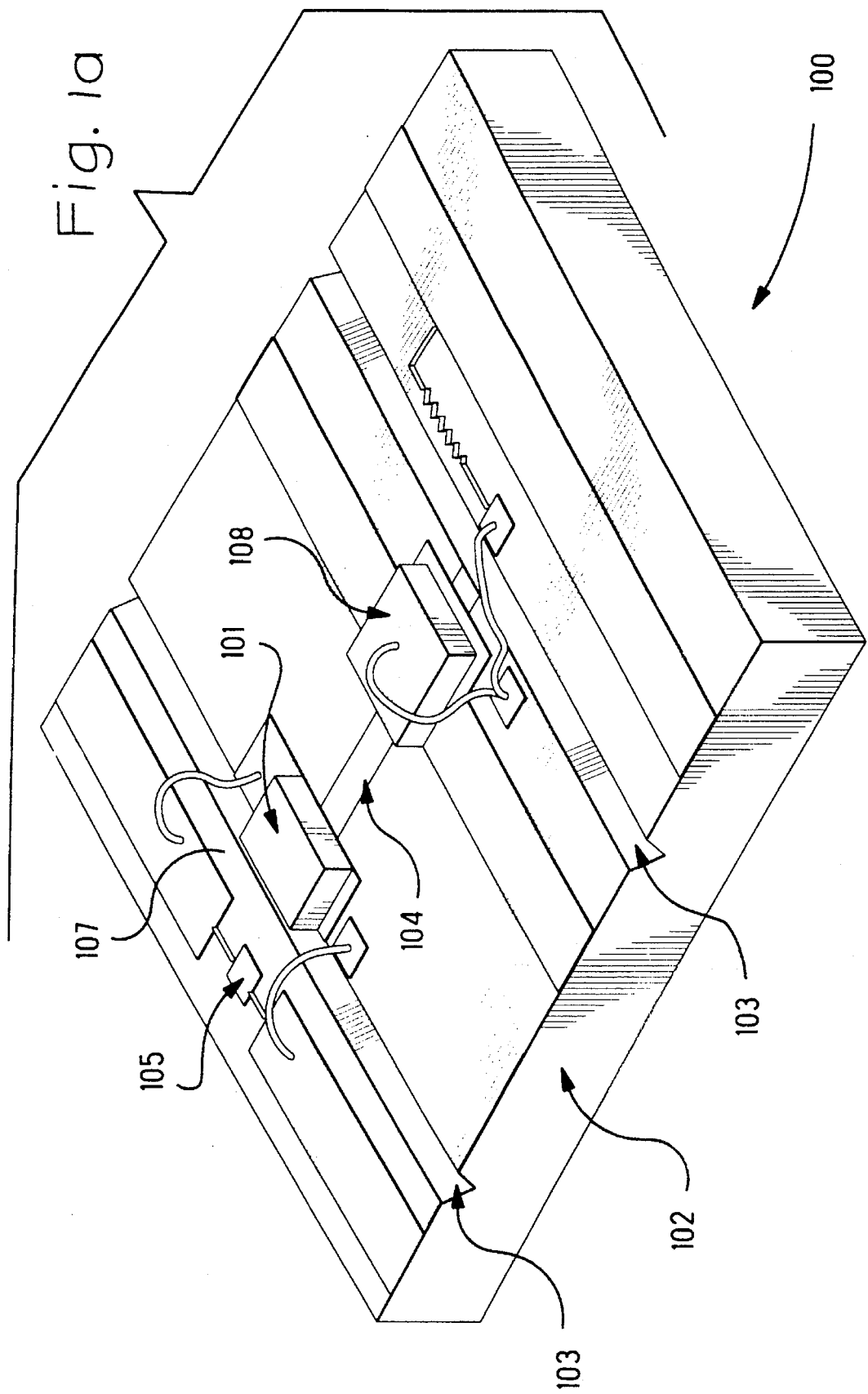

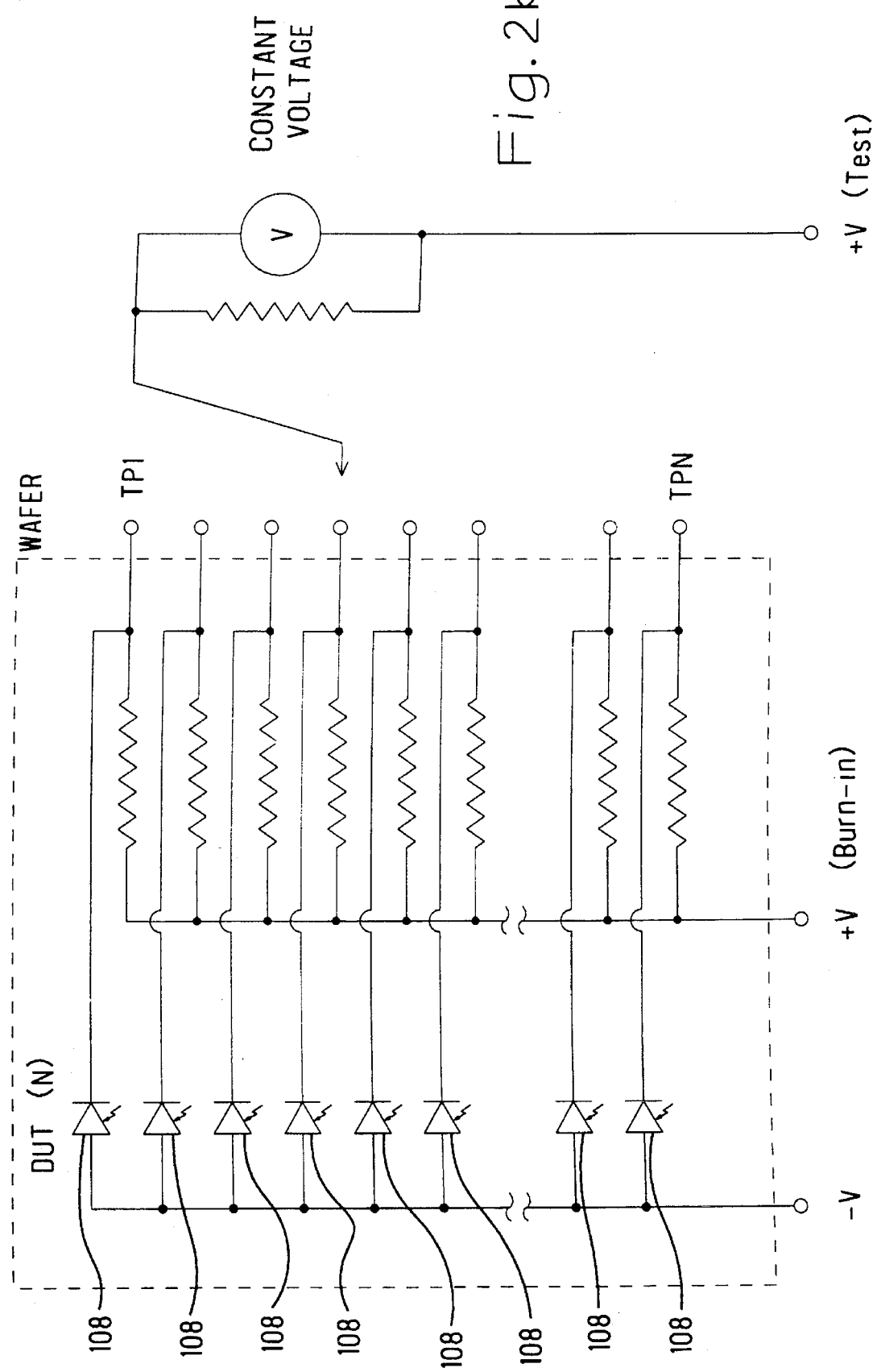

LASER/PIN ASSEMBLY WITH INTEGRATED BURN-IN ASSEMBLY

This application is a Continuation of application Ser. No. 08/393,961 filed Feb. 24, 1995, now abandoned.

FIELD OF THE INVENTION

The invention relates to semiconductor light emitting devices bonded on a wafer and having burn-in and monitoring capabilities grown in integral form on the wafer.

BACKGROUND OF THE INVENTION

In the manufacture and production of semiconductor optoelectronic devices, it is necessary to subject the devices to operation at elevated temperatures for a specified period of time to assure that the fabricated device will satisfactorily operate at elevated temperatures for long periods without failure or unacceptable performance levels. The burn-in process, as the operation at elevated temperatures is called in the art, is performed at the chip-level and the final package level of the device, and is done at constant voltage, constant current or constant power. Normally, lasers and LED's are burned-in at constant current and PIN's are burned-in at constant voltage. Generally, the method used to effect burn-in is dependant on the type of device to be burned-in and the process sequence is selected to minimize the cost of fabrication.

There are several methods that are currently being utilized to effect device burn-in. One of the more primitive techniques is to die and wire bond the device on to a submount or header that has sufficient electrical leads to connect to a burn-in system. This method requires a relatively expensive header or submount to be used in the burn-in process. To this end, the burn-in process done at the discrete element level as in this case results in the discarding of an assembly that is nearly a finished product if the device fails burn-in testing.

A second technique to effect burn-in is to die and wire bond the devices on to a wafer of submounts and bring the required electrical lines to effect burn-in to the devices by a probe card. Done singularly for each device, this method requires a large number of probes to make the needed contacts and can result in both misreadings and actual damage to the device. Accordingly a less cumbersome, more reliable technique is required.

A third method would be to electrically chain the devices together on a wafer in a fashion that would reduce the number of electrical probes required to effect burn-in. In this case, if a single device fails it may interfere with the continued burn-in of the rest of the devices that are connected in the same circuit. This will cause the failure of the burn-in process for all devices in the given test run. Accordingly, a less complex and more reliable technique is required to effect the burn-in process.

What is needed is a less complex and more reliable burn-in procedure for the burn-in of devices mounted on a wafer and not at the discrete element level. This will result in a method that allows the discarding of failed devices at the wafer level by dicing the failed device from the wafer. The cost saving in labor and materials is clearly great as the expensive final packaging is saved for devices that have passed the critical burn-in process.

SUMMARY OF THE INVENTION

The invention relates to a burn-in process at the submount wafer level for optoelectronic devices. The invention contemplates the fabrication of the burn-in circuitry on a semiconductor wafer with the devices die bonded to the wafer. The burn-in method of the present invention is readily effected in large or very large scale on the wafer. For constant current burn-in one technique is to fabricate a zener diode in parallel with each of the devices under test, and to have each device under test to be connected in series. All of the burn-in circuitry being fabricated on a common semiconductor wafer and all of the monitoring/light source devices as well as the devices to be tested having been die bonded on the wafer. In the event that a device fails by an electrical break during burn-in, the voltage across the zener diode circuit in parallel to the failed device will enable the diode to conduct current to the remaining devices under test, thereby enabling a continued test of the remainder of the devices. Another technique, for constant voltage burn-in, is to fabricate a resistor in series with each device and to connect all device resistor pairs in parallel with one another. The constant voltage source could be placed either on or off the wafer. If a device were to fail and create an electrical open, the other devices in parallel would naturally not be affected. If the device were to fail and create an electrical short, the resistor would prevent excessive current flow through the shorted device and keep the circuit as a whole from shorting. Another aspect of the invention is to have current conditioning circuitry on the wafer so that each row of chained lasers (roughly 20 in a row on the wafer) is supplied with a constant current during the burn-in process. By having the current conditioning circuitry on the wafer, many rows of lasers may be connected in parallel to a constant voltage source either on or off the wafer and so only a few electrical leads need to be in contact with the wafer. This greatly simplifies the mechanical issues by not needing a large number of electrical contacts on the wafer. Thereafter, when burn-in is complete the wafer is placed on a probe station and the individual devices are tested. The failed device(s) is (are) diced from the wafer and discarded, saving the cost and complexity of conventional burn-in techniques.

OBJECTS, FEATURES AND ADVANTAGES OF THE INVENTION

It is an object of the present invention to fabricate the burn-in circuitry directly on the semiconductor wafer and thereafter to die bond the electronic devices under test and monitoring/light source devices for the burn-in process on the same semiconductor wafer.

It is a feature of the present invention that the burn-in circuitry enables uninterrupted burn-in to be effected even though one or more of the devices to be tested fails during burn-in.

It is a feature of the present invention that the wafer is etched selectively to effect dicing of the device along desired etched grooves and also etched to effect paths for light between monitors/light sources and devices under test.

It is an advantage of the present invention that burn-in of optoelectronic devices is effected prior to the packaging of the devices, thus resulting in a substantial savings in material, fabrication and labor costs.

It is an advantage of the present invention that the devices, monitoring/light sources and burn-in circuitry are diced after burn-in and unwanted sections discarded to make efficient use of the wafer, thereby reducing fabrication costs.

It is an advantage of the present invention to have the number of connections to the wafer reduced by having current conditioning circuitry incorporated on the wafer.

BRIEF DESCRIPTION OF THE DRAWINGS

FIG. 1a is a three-dimensional view of the photoemitter/monitor silicon submount of the present invention.

FIG. 2b is a schematic diagram of the constant voltage source as well as the circuitry connected in series with the photodetectors as described herein.

DETAILED DESCRIPTION OF THE PREFERRED EMBODIMENTS

Figure 1B:
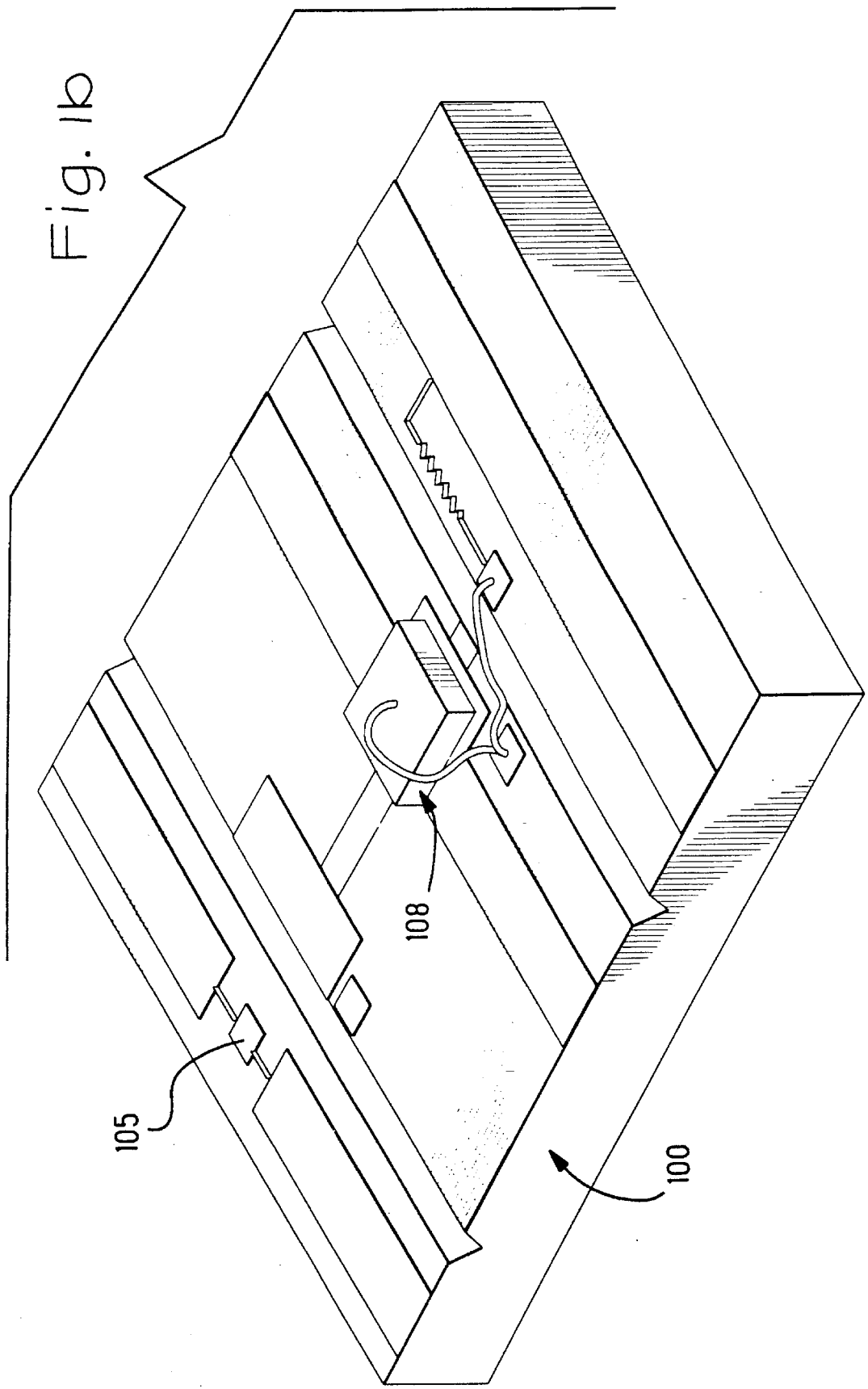
FIG. 1b is a three-dimensional view of the photodetector silicon submount of the present invention.

Turning to FIG. 1a, we see the laser/monitor silicon submount 100. This shows the device under test which is die bonded to the substrate 102 that is made of monocrystalline material, exemplary silicon. The reason that a monocrystalline material is preferred is that the v-grooves 103 and 104 are etched in preferred crystalline by techniques which are known in the art. An example of such a technique is disclosed in U.S. Pat. No. 4,210,923 to North, et al., the disclosure of which is specifically incorporated herein by reference. The details of the use the etched grooves will be discussed later. The substrate has a device to be tested 101 that is die bonded by conventional techniques for example by using a gold-tin eutectic preform or metalized area on the chip or wafer and reflowing the material with a hot gas jet or a laser energy source. The device can be a photo emitter in the form of a discrete element mounted on the substrate. The actual device to be tested is not the crucial aspect of the invention, but for purposes of illustration, applicant anticipates the use of the instant method on semiconductor lasers such as heterostructure lasers.

Figure 2A:
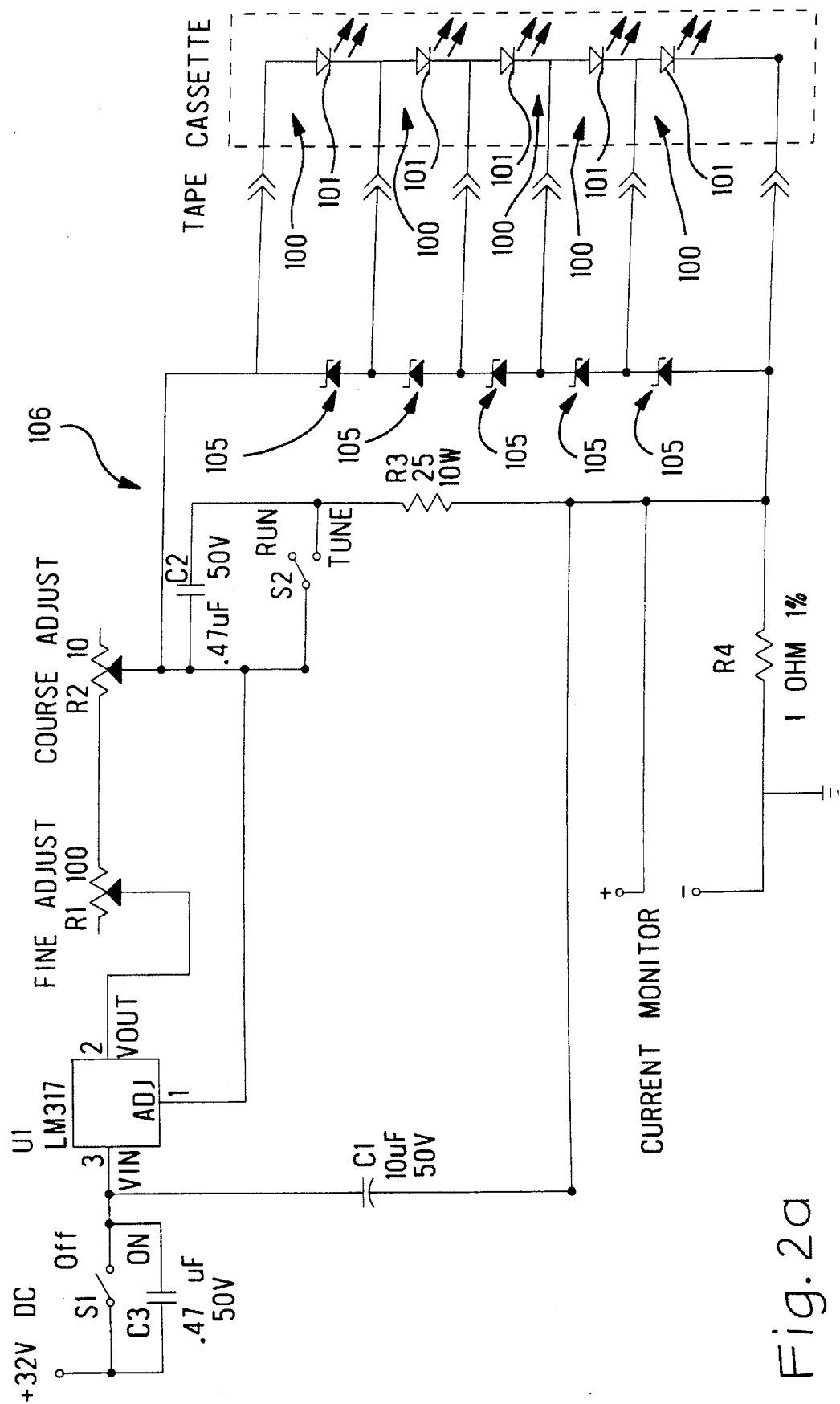
FIG. 2a is a schematic diagram of the constant current source as well as the circuitry connected in parallel with the photoemitters as described herein.

To effect the burn-in of a photo emitter 101, a pn junction diode, for example a zener diode or other suitable device 105 coupled with constant current circuitry 106 is connected parallel with the device 101, as is shown in FIG. 2a. In the event that during the burn-in process the device 101 fails, the diode or other device is designed to conduct the current to the remainder of the devices to be tested (not shown in FIG. 1). A preferred device (105) to effect the testing is a Zener diode coupled with a constant current source to maintain a desired current level should the device 101 fail. For the purposes of simplicity of discussion the Zener diode will be the focus of an illustrative example. To be sure, the Zener diode is merely a preferred example, and other devices such as a CMOS FET are possible, albeit less preferred, for use in this function. A Zener diode 105 and a constant current source function as follows. In the event that the device 101 fails and creates an electrical open, a reverse biased Zener diode 105 would reach a break-down condition, and would conduct current thereby enabling the continued testing of the remaining devices. The basic concept of the present invention is the use of a device 105 electrically in parallel with the device 101 and constant current circuitry 106 that in the testing of a device 101 supplies an impedance great enough that current flow is effectively, exclusively through the device 101, so long as the device 101 is properly operating. In the event that the device 101 fails, it is an effective break in a parallel circuit and current will flow through the device 105 and its to an identical laser/monitor submount 100 connected in series thereto (Shown schematically as in FIG. 2a, where a string of five submounts are shown as an example). If the device under burn-in fails creating a short, the constant current circuitry prevents an increase in current through other devices connected in series to the failed device that would normally be seen with such a short. Other devices and circuitry within the purview of the skilled artisan are considered within the teaching of the basic concept of the invention, and the devices and circuitry disclosed are intended to be illustrative and not in any way limiting.

Figure 3A:
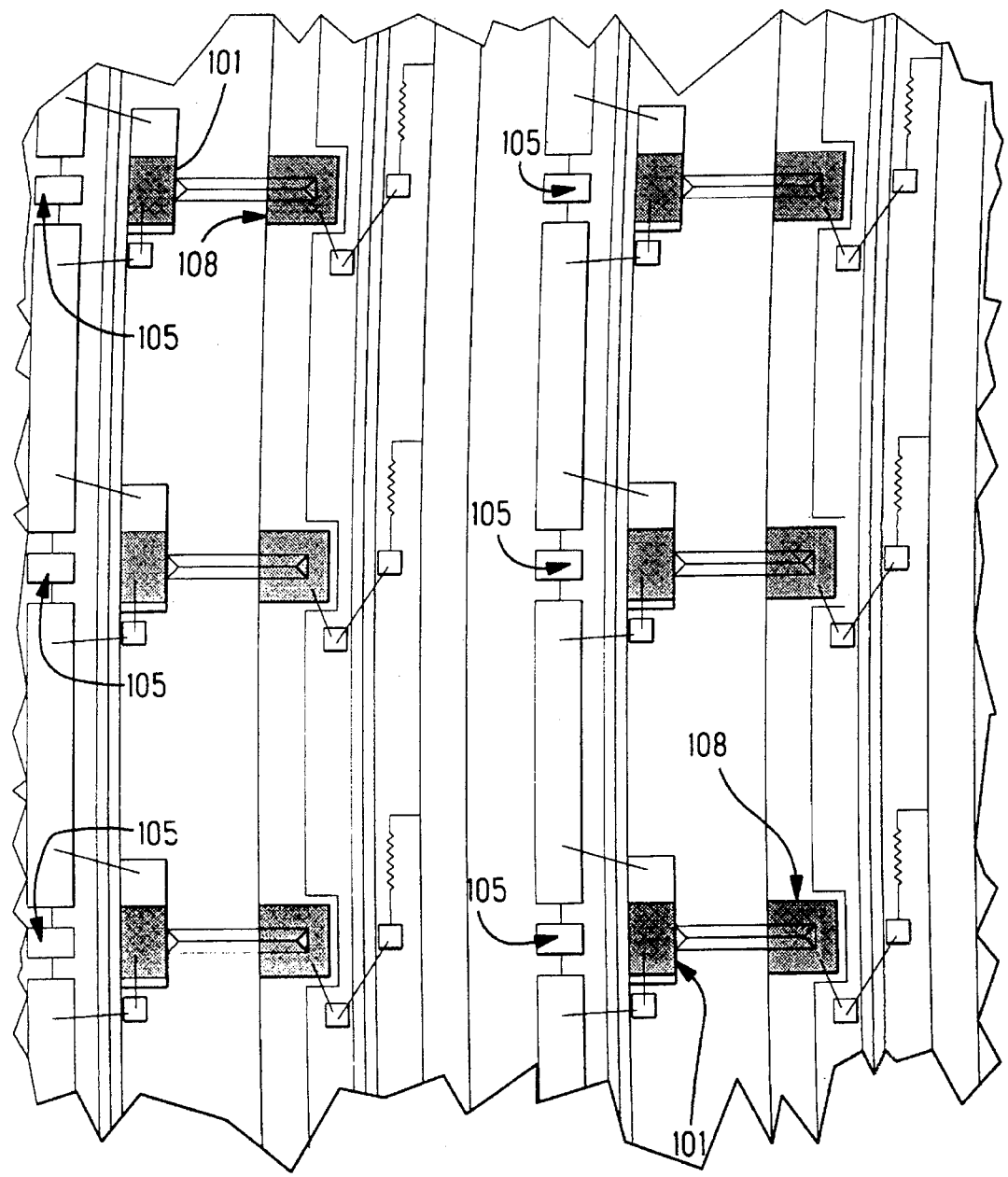
FIG. 3a is a top view of a section of the wafer showing the various components as well as the etched grooves required to effect the burn-in testing of the photoemitters as described herein.
Figure 5:
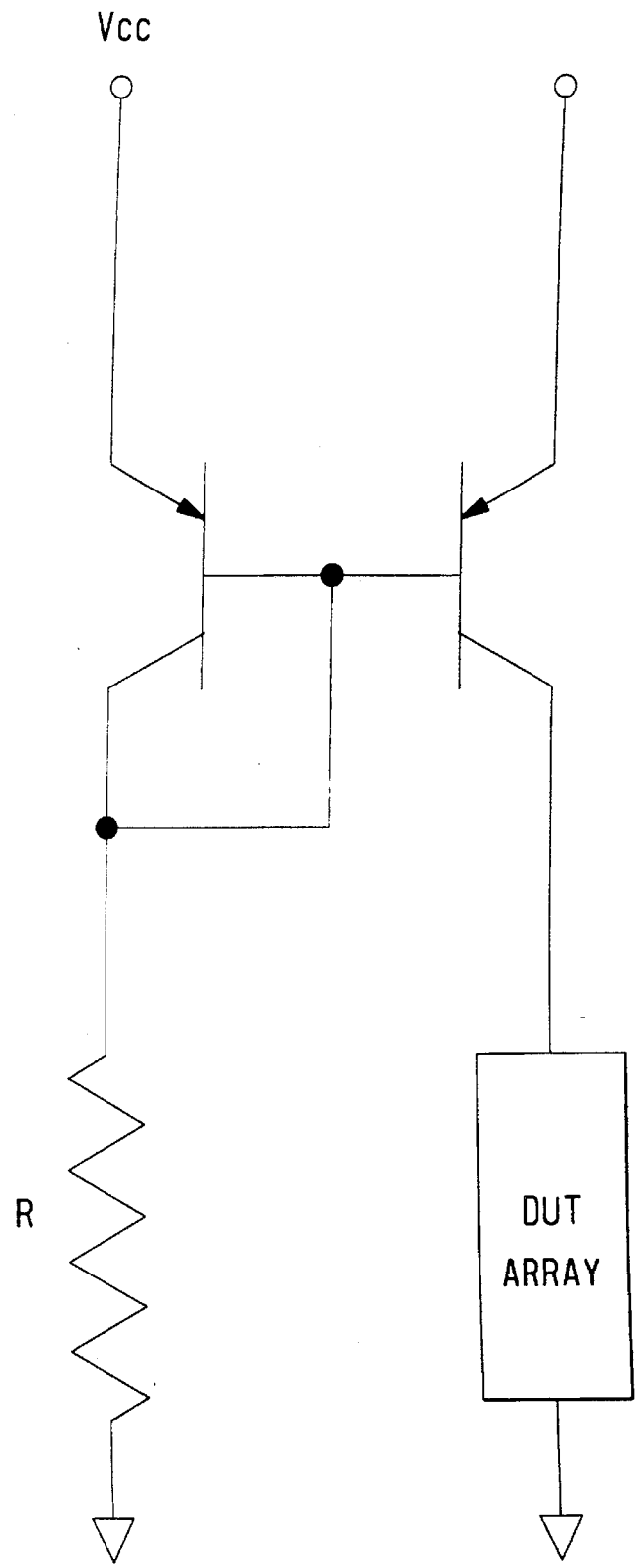
FIG. 5 is a schematic diagram of a typical constant current circuit to effect the burn-in to the device under test (DUT).

In operation, the device under test 101 is supplied a constant current via lead 107. A typical constant current circuit is shown in FIG. 5. In the case of an emitter under test, for example a laser, the p-doped side is mounted down, and thereby the active region is closest to the substrate 102. The light is emitted from the edge of the laser and is impingent on the monitor 108 via the etched v-groove 104. FIG. 3a shows a top view of the wafer having devices to be tested (in this example lasers) 101 and the monitors 108, the devices under test being connected in series as described above. A reflective surface 109 at the end of the v-groove 104 that is closest to the detector. Because the detector 108 requires radiation to be impingent on its lower surface, the light must be reflected upward to the detector. This surface is merely a selectively etched monocrytstalline plane that is etched by techniques known in the art, as for example taught in the patent to North, et al. as disclosed above. A reflective surface such as deposited gold is laid down by conventional techniques. It is of importance to note that the deposition of the reflective surface is preferable, however the etched silicon at 109 can be left without a deposited reflective surface such as gold, since the silicon will effect quite well the reflection to the monitor detector 108. The monitor detector 108 thereby supplies current to a monitoring circuit (not shown) that provides data of the performance of the device after burn-in, and also indicative of a device that fails during burn-in testing.

Figure 3B:
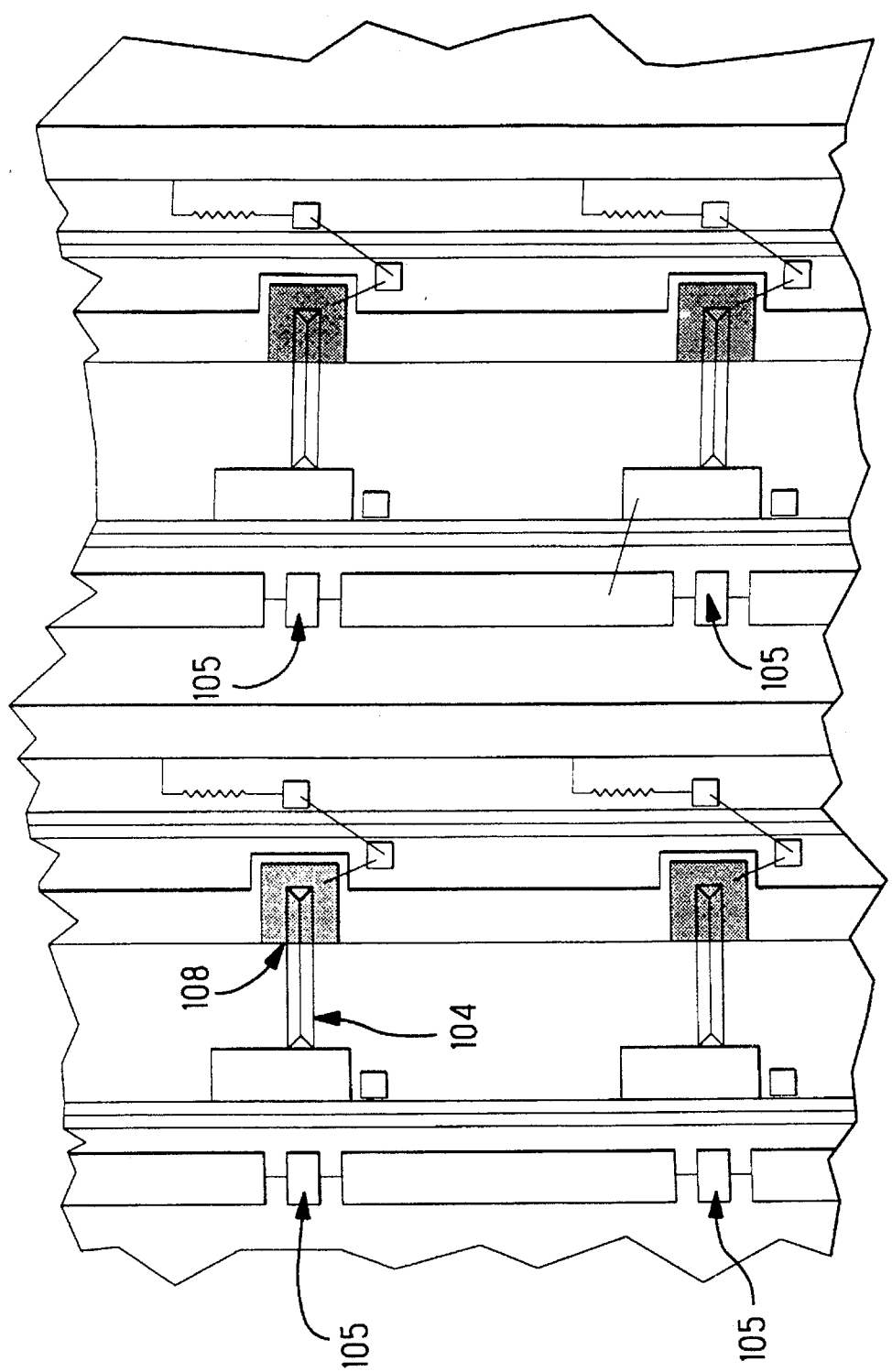
FIG. 3b is a top view of a section of the wafer showing the various components as well required to effect the burn-in testing of photodetectors as described herein.
Figure 4A:
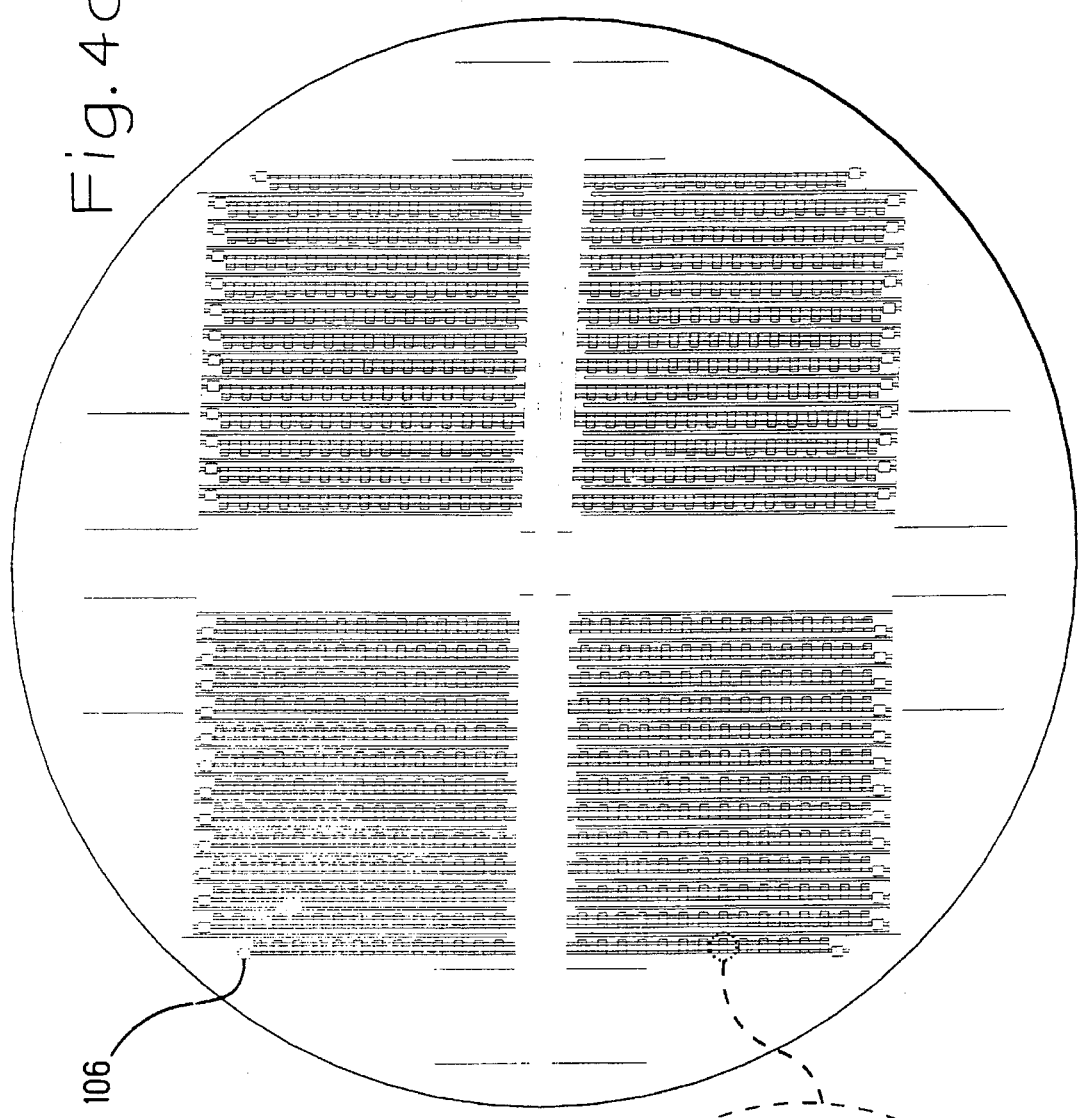
FIG. 4 is a top view of the instant invention showing the wafer with the devices, grooves and circuitry on the wafer in very large scale. A section is shown in explode view to show details of the layout of the photodetectors and photoemitters.
Figure 4B:
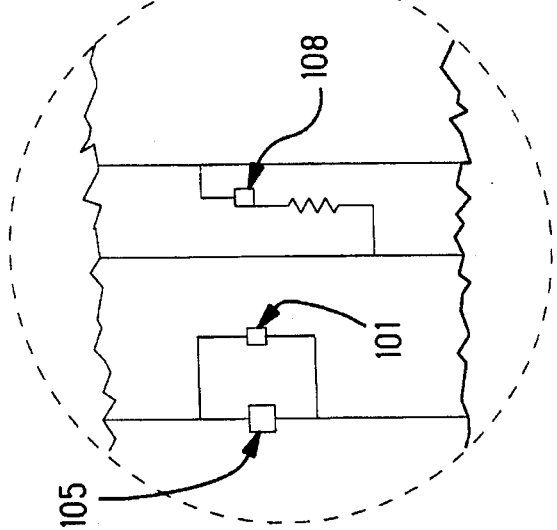

The burn-in of the detector is effected by die and wire bonding the detector 108 to the wafer as is shown in FIG. 1a. The burn-in is effected at very high temperature, as compared to the laser burn-in procedure (for example, typically, the laser is burned in at a temperature of about 85° C., whereas monitor PIN's are burned in at about 200° C.). The burn-in of the detector 108 is effected by testing the electrical characteristics under burn-in conditions (known as dark-current testing). This is done preferably by connecting in series a selected resistance with each detector and supplying a constant voltage to the wafer. Because the monitors are connected in parallel, should one of them fail and create a short, all current would by-pass the other detectors under test, and the burn-in testing would effectively cease. However, by selecting the resistance to be high enough, should one detector fail and create a short, the resistance will insure that adequate current will flow to the remaining detectors under test. This is shown in top view in FIG. 3b. Furthermore, as can be seen from FIG. 3b, the detectors 108 are connected with one another in parallel, as opposed to when the lasers (or emitters) are burn-in tested, they are connected in series, as was previously described above. After the burn-in of the detectors is completed, an emitter (for example laser) can then be bonded to the wafer in the manner described above and the laser can be burn-in tested on the same wafer, using the already tested detector as the monitor. In this way, the present invention contemplates a clearly efficient use of the wafer to effect first the burn-in testing of a large number of photodetectors followed by burn-in testing of a large number of photoemitters, all on the same wafer. As previously described, the photoemitters are connected in series to one another and in parallel to the burn-in circuitry (105 and 106 as seen in FIG. 1a), and the photodetectors are connected in parallel to each other and in series to the resistance that enables continued burn-in testing should the a detector fail and create a short. This is also shown in exploded view in FIG. 4. Accordingly, the invention can be effected by first etching of the v-grooves on the wafer for facilitating the eventual dicing of submounts (103) as well as v-grooves (104) for efficient communication of light from the emitters to the monitor detectors is carried out as described above. Thereafter, the detectors 108 are die and wire bonded to the substrate, tested, and the emitters are then die and wire bonded to the substrate and tested as was previously described. On large scale, this can be seen in FIG. 4.

In operation, the temperature of the burn-in process is controlled by methods well known in the art. The preferred technique for burn-in testing of the instant invention is submersion in a slow moving conductive inert liquid (for example commercially available Flurinert), which enables testing at high temperatures. The heat is generated and controlled preferably by use of a convection oven or a thermal electric heater/cooler employing the peltier effect.

Once the burn-in process is complete, the wafer is tested at a commercially available wafer probe station (not shown). The optical characteristics of the individual photoemitters or photodetectors are measured by the use of the monitor (in the case of an emitter under test) or a laser (in the case of a detector under test), the monitor or laser being passively aligned to the device under test during the die bonding process. Once characteristics of the device are determined, and those devices under test which have failed the burn-in technique are located, the wafer is diced preferably by cleaving along v-grooves 103 and the individual submounts. While cleaving is the preferred method of dicing the wafer, etching or diamond sawing along the along the lower surface adjacent to the v-grooves 103 will effect the intended result.

Figure 6A:
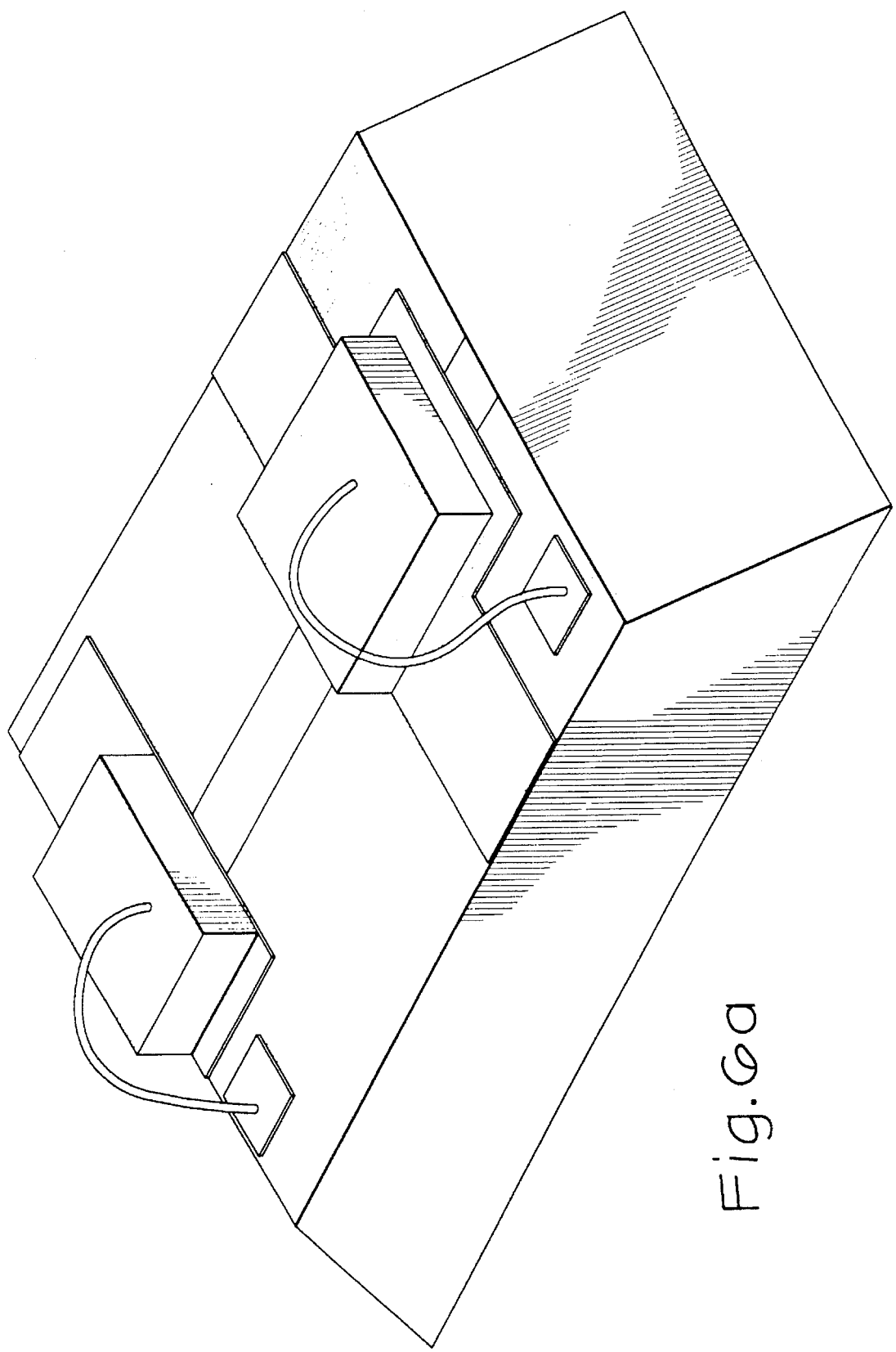
FIG. 6a is a three dimensional view of the diced submount having the photodetector and photoemitter mounted thereon.
Figure 6B:
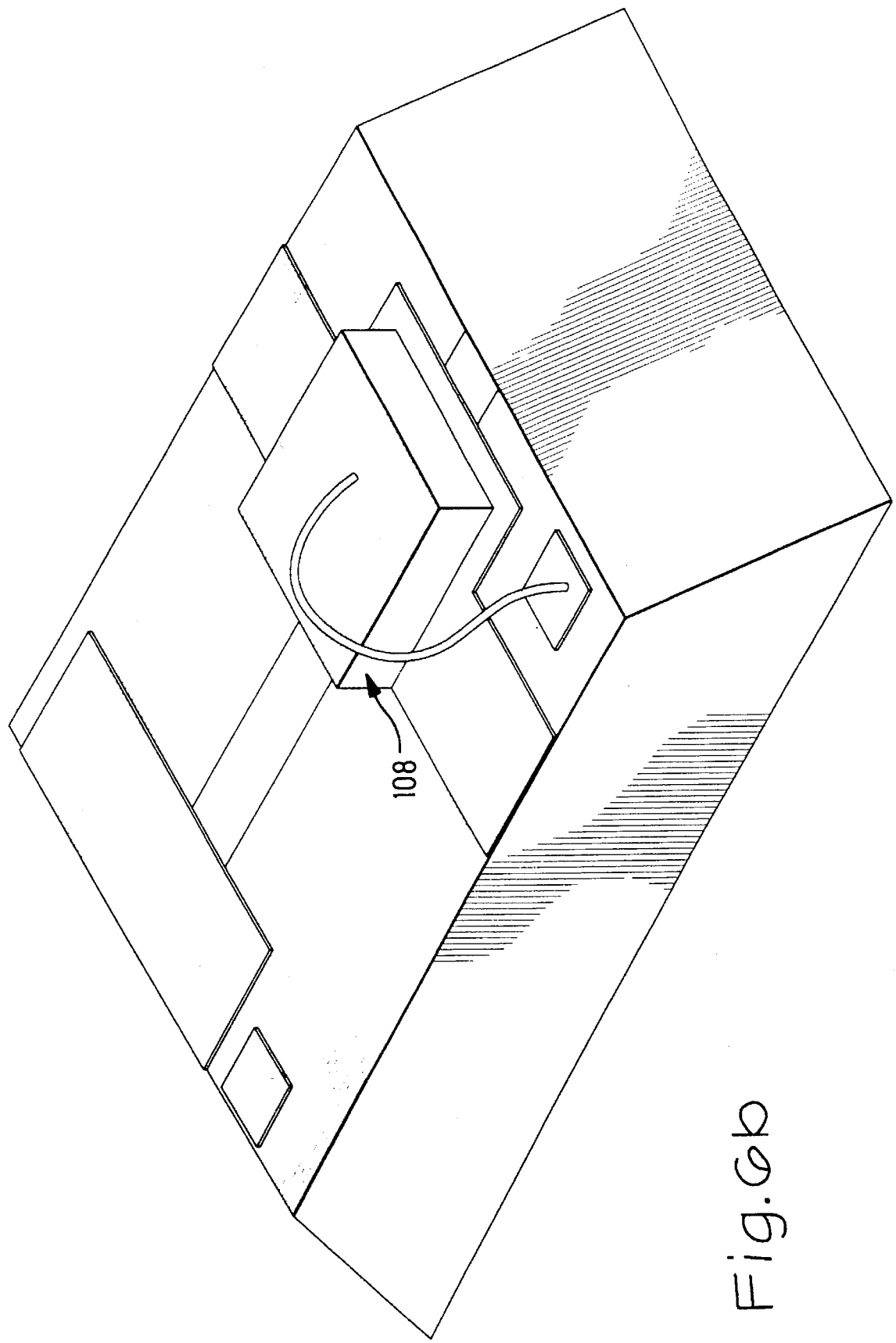
FIG. 6b is a three dimensional view of the diced submount having the photodetector mounted thereon.

An individual submount having the burn-in monitor and the laser under test is shown in FIG. 6a, while an individual submount having the detector alone is shown in FIG. 6b. The circuitry that provided the burn-in voltage/current may or may not be removed from the submounts at this point in the process. The leads that are used to test the laser or photodiode may remain with the laser/photodiode on its submount if it is required in the packaged component. Finally, with or without the burn-in circuitry, the tested device on the submount may then be assembled into higher level packages known in the industry.

The preferred embodiments having been described in detail, it will be appreciated by the artisan of ordinary skill that various modifications and changes can be made therein without departing from the theme and spirit of a method of burn-in testing of electronic devices on a wafer, thereby enabling the burn-in to be effected at the device level and in very large scale. Furthermore, the testing is low cost and uninterrupted, with the devices that pass the testing mounted on submounts that are ready for further packaging.

We claim:

1. An apparatus for burn-in testing photo emitting devices, comprising:

a. a substrate having a top surface, a bottom surface and a selected thickness therebetween;

b. a plurality of photodectors mounted on said top surface, said photodetectors electrically connected another in parallel;

c. a plurality of photoemitters mounted on said top surface of said substrate, each of said photoemitters in optical communication with one of said photodetectors, each of said photodetectors monitoring one of said photoemitters during burn-in testing, and each of said photoemitters electrically connected in series to one another;

d. a plurality of electronic devices electrically connected in series to one another, and a selected one of said devices electrically connected in parallel to a selected one of said photoemitters; and e. a source of constant current connected electrically to said plurality of light emitters, thereby enabling burn-in testing of said photoemitters.

2. An apparatus for burn-in testing photo emitting devices as recited in claim 1, wherein said substrate is selectively etched to facilitate dicing said substrate into optical submounts after burn-in testing is complete.

3. An apparatus as recited in claim 1, wherein said optical communication is effected by a groove selectively etched between said photodetectors and said photoemitters.

4. An apparatus for burn-in testing photodetectors, comprising:

a. a substrate having a top surface, a bottom surface and a selected thickness therebetween;

b. a plurality of photodetectors mounted on said top surface, said photodetectors connected in parallel with one another;

c. a plurality of electronic devices for enabling uninterrupted burn-in testing, one of said plurality of electronic devices connected in series to one of said photodetectors; and d. a source of constant voltage connected to said plurality of photodetectors, whereby burn-in testing is effected by supplying constant voltage to each of said photodetectors.

5. An apparatus for burn-in testing optical transmitters, comprising:

a substrate having a first surface, a second surface and a selected thickness therebetween;

an optical transmitter to be tested mounted on said top surface of said substrate, said transmitter in optical communication with an optical monitor mounted on said top surface of said substrate; and a circuit connected electrically in parallel with said transmitter, said circuit being mounted on said substrate, whereby burn-in testing is effected and should said optical transmitter fail during burn-in testing, current flows through said circuit.

6. An apparatus as recited in claim 5, wherein grooves are etched on said top surface of said of said substrate in selected locations for dicing said substrate into a submount assembly.

7. An apparatus as recited in claim 5, wherein said optical communication is effected by a groove selectively etched on said top surface of said substrate between said optical transmitter and said optical monitor.

* * * * *